United States Patent
Sorada et al.

(10) Patent No.: US 7,564,073 B2
(45) Date of Patent: Jul. 21, 2009

(54) CMOS AND HCMOS SEMICONDUCTOR INTEGRATED CIRCUIT

(75) Inventors: Haruyuki Sorada, Hirakata (JP); Akira Asai, Osaka (JP); Takeshi Takagi, Kyoto (JP); Akira Inoue, Takatsuki (JP); Yoshio Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 227 days.

(21) Appl. No.: 11/294,566

(22) Filed: Dec. 6, 2005

(65) Prior Publication Data

US 2006/0086988 A1    Apr. 27, 2006

Related U.S. Application Data

(62) Division of application No. 10/866,093, filed on Jun. 14, 2004, now Pat. No. 7,087,473.

(30) Foreign Application Priority Data

Jun. 13, 2003    (JP) ............... 2003-169249

(51) Int. Cl.
*H01L 27/04*    (2006.01)
(52) U.S. Cl. ............... 257/192; 257/369; 257/E25.029
(58) Field of Classification Search ............... 257/192, 257/369, E25.029, E29.14, E29.249, E29.252
See application file for complete search history.

(56) References Cited

U.S. PATENT DOCUMENTS

| 4,701,718 A | * | 10/1987 | Wrathall et al. ............ 330/253 |
| 5,523,606 A | * | 6/1996 | Yamazaki ............... 257/370 |
| 6,310,367 B1 | * | 10/2001 | Yagishita et al. ............ 257/190 |

(Continued)

FOREIGN PATENT DOCUMENTS

JP    2768719    4/1998

(Continued)

OTHER PUBLICATIONS

Hoyt, J. L., et al. "Strained Silicon MOSFET Technology" IEDM 2002, pp. 23-26.

*Primary Examiner*—Minh-Loan T Tran
*Assistant Examiner*—W. Wendy Kuo
(74) *Attorney, Agent, or Firm*—McDermott Will & Emery LLP

(57) ABSTRACT

A semiconductor integrated circuit fabrication method according to this invention includes: a step of forming a pair of first device forming regions and a pair of second device forming regions in a surface layer portion of a semiconductor substrate by surrounding each of the regions by device isolation; a step of forming a first oxide film covering the surface of the semiconductor substrate after the preceding step; a step of removing an intended portion of the first oxide film to expose the pair of second device forming regions; a step of forming a pair of heterojunction structures, by selective epitaxial growth, on the pair of second device forming regions thus exposed; a step of forming a second oxide film covering the surface of the substrate after the preceding step; and a step of forming a pair of gate electrodes above each of the pair of first device forming regions and the pair of second device forming regions, whereby a normal complementary MOS transistor and a heterojunction complementary MOS transistor are eventually formed in the pair of first device forming regions and the pair of second device forming regions, respectively.

8 Claims, 14 Drawing Sheets

U.S. PATENT DOCUMENTS 6,512,252 B1 * 1/2003 Takagi et al. ................. 257/192
6,900,094 B2 * 5/2005 Hammond et al. ........... 438/238

FOREIGN PATENT DOCUMENTS

| JP | 10-214906 | 8/1998 |
| JP | 2002-94060 | 3/2002 |
| JP | 2002-314089 | 10/2002 |

* cited by examiner

| ITEM | COMPARISON BETWEEN THE PRESENT INVENTION AND PRIOR-ART TECHNOLOGIES | | |
|---|---|---|---|
| COST | BiCMOS | >HDTCMOS | >RFCMOS ~ |
| ANALOG PERFORMANCE | BiCMOS | >HDTCMOS | >RFCMOS |
| DIGITAL PERFORMANCE | BiCMOS | <HDTCMOS | >RFCMOS |

Fig.10

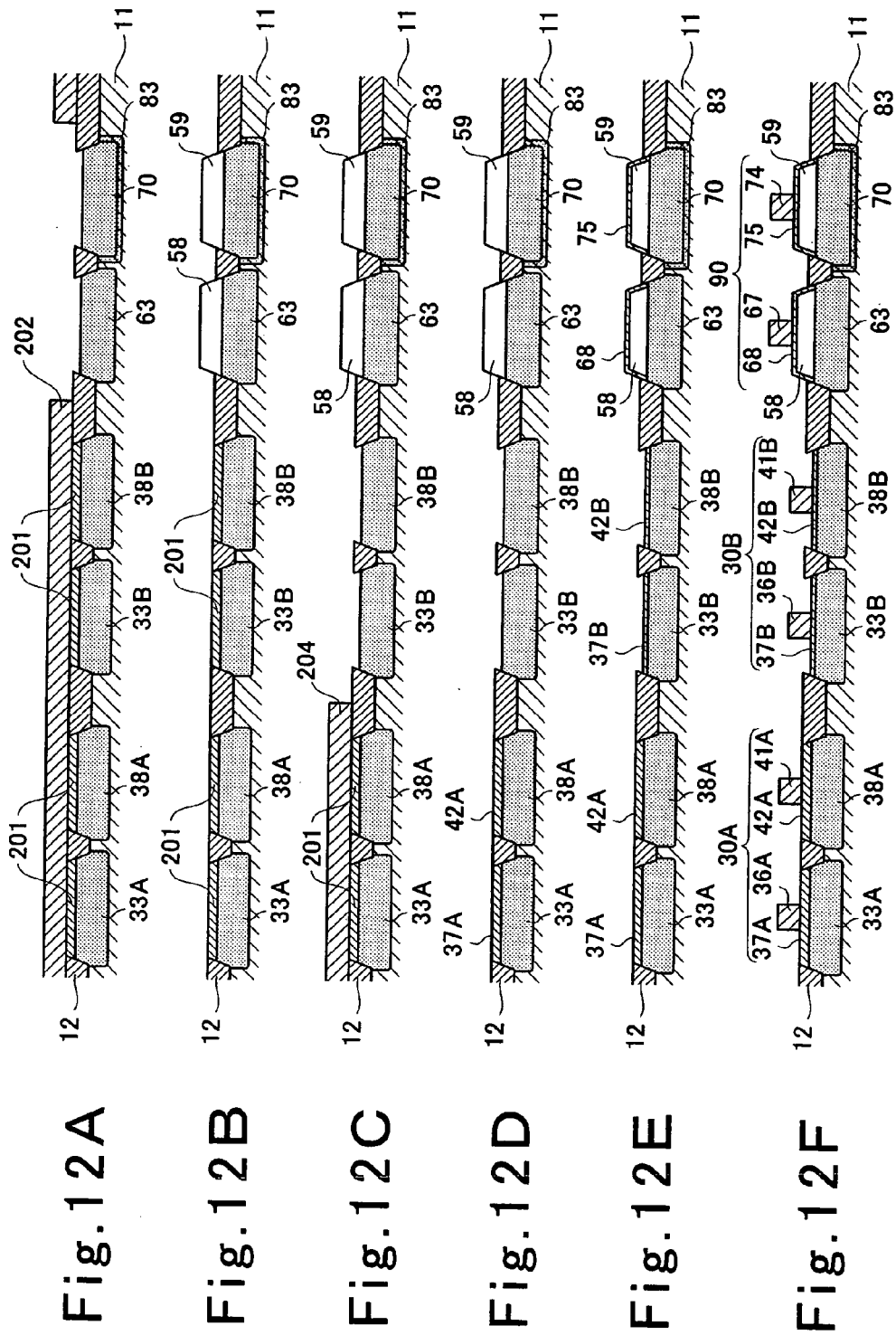

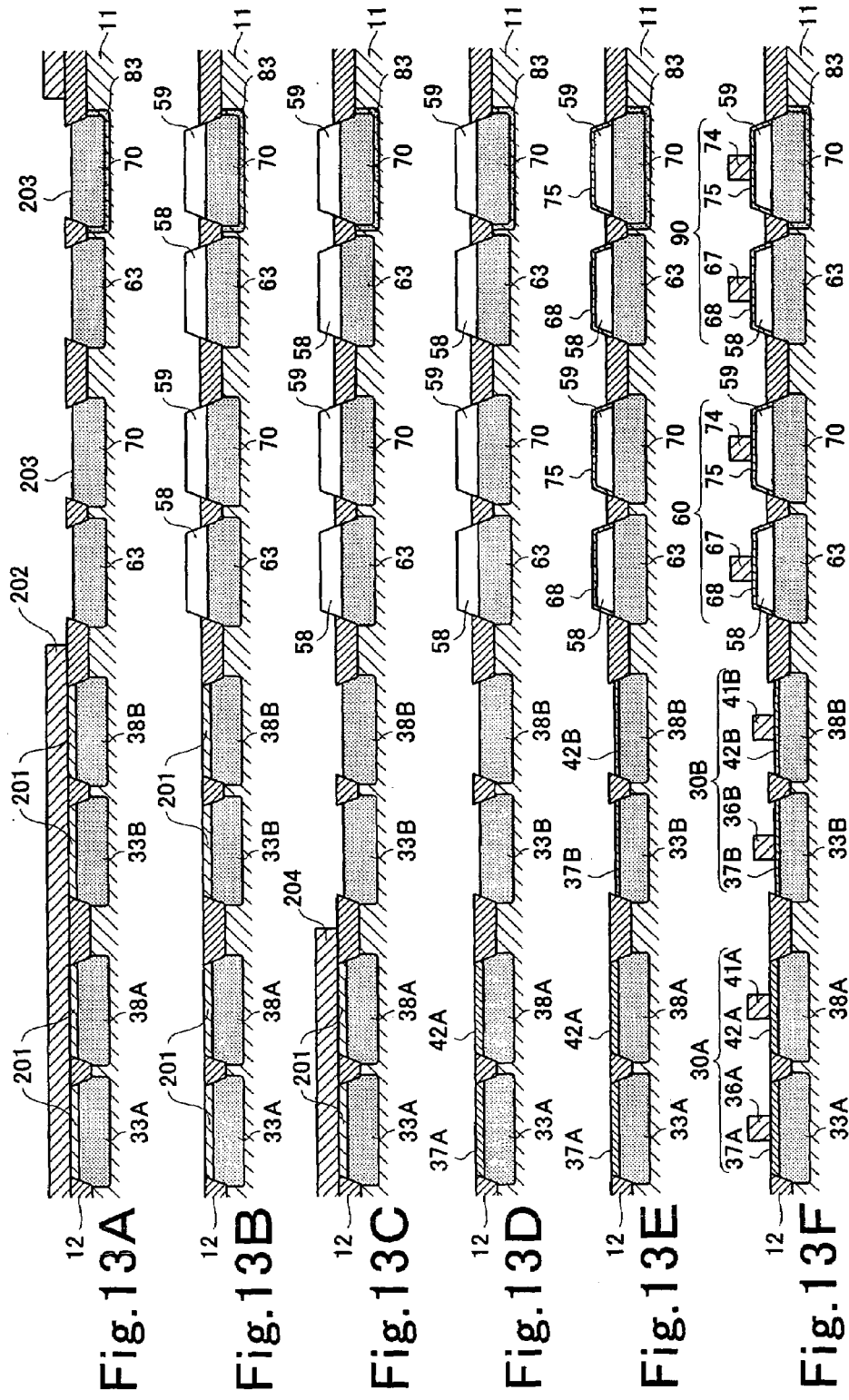

CMOS AND HCMOS SEMICONDUCTOR INTEGRATED CIRCUIT

This application is a divisional of U.S. patent application Ser. No. 10/866,093, filed Jun. 14, 2004, now U.S. Pat. No. 7,087,473 which is based on Japanese Patent Application No. JP 2003-169249, filed Jun. 13, 2003 the contents of which are hereby incorporated by reference.

BACKGROUND OF THE INVENTION

1. Field of the Invention

The present invention relates to a semiconductor integrated circuit and a fabrication method thereof and to a semiconductor integrated circuit incorporating an analog circuit and/or a digital circuit and a fabrication method thereof.

2. Description of the Related Art

The market expects that wireless network, and downsizing and reduced power consumption of mobile phones will be realized in preparations for the forthcoming ubiquitous era. For this purpose, it is earnestly desired that LSIs and memory to be incorporated in terminals have higher operation speed and higher integration and require lower power consumption. There are a number of radio communication standards including Bluetooth and wireless local area network. To accommodate several radio communication standards in accordance with uses, demands are increasing for semiconductor circuits of the type incorporating both a high-frequency analog circuit for radio communications and a digital circuit for logic operations.

Hitherto, semiconductor circuits for radio communications for use in mobile phones and the like have been fabricated by the so-called "BiCMOS technology" which provides a BiCMOS incorporating both a bipolar transistor and a complementary MOS transistor (complementary metal oxide semiconductor transistor, to be abbreviated as "CMOS" hereinafter). A MOS transistor has a basic structure comprising a metal, an oxide and a semiconductor in which a gate insulator comprising the oxide is formed on the semiconductor and a gate electrode comprising the metal is formed on the gate insulator. At present, the main stream is the technology called "SiGe BiCMOS technology", which uses a hetero bipolar transistor including a SiGe base layer (hereinafter will be referred to as "SiGe hetero bipolar transistor") as the bipolar transistor. The concept of the SiGe BiCMOS technology is illustrated in FIG. 11A. According to the SiGe BiCMOS technology, as illustrated in FIG. 11A, a semiconductor integrated circuit 301 formed by a single chip has an analog signal processing section 3 and a digital signal processing section 2, wherein the transistor of the analog signal processing section 3 which calls for high performance consists of a SiGe hetero bipolar transistor, whereas the other transistor of the analog signal processing section 3 and all the transistors of the digital signal processing section 2 each consist of a complementary MOS transistor comprising ordinary MOS transistors (hereinafter will be referred to as "normal CMOS"). One of the advantages of such SiGe BiCMOS technology is that both a SiGe hetero bipolar transistor and a normal CMOS can be incorporated in a semiconductor integrated circuit and, hence, a high-performance semiconductor integrated circuit incorporating both an analog circuit and a digital circuit can be realized on a single chip, which leads to a lower cost than is required to fabricate an integrated circuit with plural chips including a compound chip of a group III-V semiconductor such as GaAs and a normal CMOS chip. However, the SiGe BiCMOS technology requires a lengthy bipolar transistor forming process and, by comparison, the number of process steps required of the SiGe BiCMOS process is about 1.5 times as large as that required of an ordinary CMOS process. For this reason, the SiGe BiCMOS technology is more costly than the technology using normal CMOSs for all the required CMOSs (hereinafter will be referred to as "ordinary CMOS technology"). In terms of device characteristics, the threshold voltage of a bipolar transistor is determined by the diffusion potential between the base and the emitter; however, there is a limit to the threshold voltage (about 0.55V). For this reason it is said that any further reduction in voltage or power consumption is impossible.

In view of this situation, attention has recently been focused on the so-called RF CMOS technology (radio frequency CMOS technology) intended to construct a high-frequency analog circuit comprising a CMOS, which is less costly and allows a reduction in voltage to be realized. This technology has started being put to practical use. FIG. 11B illustrates the concept of the RF CMOS technology. According to the RF CMOS technology, as illustrated in FIG. 11B, a semiconductor integrated circuit 301 formed by a single chip has an analog signal processing section 3 and a digital signal processing section 2, wherein a CMOS of the analog signal processing section 3 which calls for high performance consists of a so-called RF CMOS, whereas the other CMOS of the analog signal processing section 3 and all the CMOSs of the digital signal processing section 2 consist of a normal CMOS each. Since such RF CMOS technology realizes a one-chip integrated circuit by forming both an analog circuit and a digital circuit with use of CMOSs only, the number of additional process steps is small and, hence, the required cost can be kept comparable to the cost required of the normal CMOS technology. However, the RF CMOS is inferior to the bipolar transistor in performance characteristics, such as mutual conductance and low-frequency noise, which are important parameters as analog characteristics. A problem with the present state of this technology is to improve these performance characteristics.

There is known a technique of enhancing the performance of a CMOS, according to which a CMOS comprising heterojunction MOS transistors (hereinafter will be referred to as "HCMOS") and a MOS transistor are formed on the same substrate (see Japanese Patent Laid-Open Publication No. HEI 10-214906, paragraph [0112]).

A strained silicon CMOS has been proposed as another technique of enhancing the performance of a CMOS (see Japanese Patent Laid-Open Publication No. 2002-94060).

As a technique of enhancing the performance of a MOS transistor itself, a heterojunction dynamic threshold MOS transistor (hereinafter will be abbreviated as "HDTMOS") has been proposed (see Japanese Patent Laid-Open Publication No. 2002-314089).

A strained silicon MOS transistor has been proposed as another technique of enhancing the performance of a MOS transistor itself (see J. L. Hoyt and other seven persons, Strained Silicon MOSFET Technology, International Electron Device Meeting (IEDM) 2002, P23-26).

The performance of a CMOS has so far been improved through scale down. However, the low-frequency noise, which is an important parameter among analog characteristics, tends to become serious by scale down. For this reason, a low-cost, one-chip semiconductor integrated circuit incorporating both a high-frequency analog circuit of high performance and a digital circuit, has not been realized yet as a semiconductor integrated circuit having a communication function which is expected to grow from now on.

SUMMARY OF THE INVENTION

The present invention has been made in view of the foregoing problems and has an object to provide a low-cost, one-chip semiconductor integrated circuit incorporating both a high-frequency analog circuit of high performance and a digital circuit, and a fabrication method thereof.

To attain the object mentioned above, the present invention provides a method of fabricating a semiconductor integrated circuit in which a normal complementary MOS transistor and a heterojunction complementary MOS transistor are formed on a same substrate, the normal complementary MOS transistor comprising ordinary MOS transistors each having a basic structure including a metal, an oxide and a semiconductor, the semiconductor consisting of a single semiconductor, the heterojunction complementary MOS transistor comprising heterojunction MOS transistors each having said basic structure, the semiconductor of said basic structure consisting of different semiconductors from each other forming a heterojunction, the method including: a step A of forming a pair of first device forming regions and a pair of second device forming regions in a surface layer portion of a semiconductor substrate by surrounding each of the regions by device isolation and then forming a pair of p-well and n-well in each of the pair of first device forming regions and the pair of second device forming regions; a step B of oxidizing an entire surface of the semiconductor substrate to form a first oxide film covering the entire surface after the step A; a step C of removing a portion of the first oxide film which overlies the pair of second device forming regions to expose the pair of second device forming regions; a step D of forming a pair of heterojunction structures, by selective epitaxial growth, on the pair of second device forming regions thus exposed; a step E of oxidizing the entire surface of the semiconductor substrate to form a second oxide film covering the surface of the substrate including a surface of the pair of heterojunction structures after the step D; and a step F of forming a pair of gate electrodes above each of the pair of first device regions and the pair of second device regions after the step E, whereby the normal complementary MOS transistor and the heterojunction complementary MOS transistor are eventually formed in the pair of first device forming regions and the pair of second device forming regions, respectively. With this procedure, the heterojunction MOS transistors realize a low-voltage operation and reduced low-frequency noise and hence can form a high-performance analog signal processing section. Further, a digital signal processing section comprising the normal complementary MOS transistor can be formed on the same substrate. It is therefore possible to realize a low-cost, one-chip semiconductor integrated circuit incorporating both a high-performance analog circuit and a digital circuit. Since the first oxide film which will serve as a gate insulator of the normal complementary MOS transistor is formed prior to the selective epitaxial growth, the number of times of heat treatment required after the selective epitaxial growth is reduced by one as compared to the case where the first oxide film is formed after the selective epitaxial growth and, hence, the process is simplified by the reduction in the number of times of heat treatment. Moreover, since the number of times of heat treatment required after the selective epitaxial growth is reduced, strain of the heterojunction structure of each epitaxially grown portion is inhibited to relax, which allows the characteristics of the heterojunction structure to be exhibited advantageously. The "metal", as used in the present specification, is meant to include semiconductors imparted with electric conductivity by impurity doping or like means (polysilicon for example) other than single crystal semiconductors.

It is possible that: at the step A, the pair of first device forming regions, the pair of second device forming regions and a pair of third device forming regions are formed in the surface layer portion of the semiconductor substrate by device isolation; at the step D, after the formation of the pair of heterojunction structures on the pair of second device forming regions exposed, a portion of the first oxide film which overlies the pair of third device forming regions is removed to expose the pair of third device forming regions; at the step E, the entire surface of the semiconductor substrate is oxidized to form a second oxide film covering the surface of the substrate including the surface of the pair of heterojunction structures and the pair of third device forming regions thus exposed after the step D; and at the step F, a pair of gate electrodes are formed above each of the pair of first device forming regions, the pair of second device forming regions and the pair of third device forming regions after the step E, whereby the normal complementary MOS transistor is eventually formed in each of the pair of first device forming regions and the pair of third device forming regions, while the heterojunction complementary MOS transistor eventually formed in the pair of second device forming regions. This feature makes it possible to form two types of normal complementary MOS transistors which are different from each other in gate insulator thickness, hence, in breakdown voltage on the same substrate while inhibiting deterioration in the characteristics of the heterojunction structures of the heterojunction complementary MOS transistor.

The first oxide film may be substantially thicker than the second oxide film. This feature makes it possible to form a normal complementary MOS transistor adapted to high Vdd and a heterojunction complementary MOS transistor on the same substrate while inhibiting deterioration in the characteristics of the heterojunction structures of the heterojunction complementary MOS transistor.

At the step D, the heterojunction structures may be epitaxially grown using the first oxide film as a mask.

At the step D, the heterojunction structures may be formed by epitaxially growing a Si layer and a SiGe layer alternately. With this feature, the characteristics of the SiGe heterojunction enable the heterojunction complementary MOS transistor to operate at a higher speed.

A semiconductor integrated circuit according to the present invention includes: a single substrate; a normal complementary MOS transistor comprising ordinary MOS transistors each having a basic structure including a metal, an oxide and a semiconductor, the semiconductor consisting of a single semiconductor; and a heterojunction complementary MOS transistor comprising heterojunction MOS transistors each having said basic structure, the semiconductor of said basic structure consisting of different semiconductor from each other forming a heterojunction, wherein: one or more such normal complementary MOS transistors and one or more such heterojunction complementary MOS transistors are formed on the single substrate; a portion of each of the heterojunction MOS transistors including the heterojunction is epitaxially grown on the substrate; a under surface of the epitaxially grown portion of each of the heterojunction MOS transistors and a under surface of a gate insulator of each of the ordinary MOS transistors are located at substantially equal depth in a direction along the thickness of the substrate. With this construction, the heterojunction MOS transistors realize a low-voltage operation and reduced low-frequency noise and hence can form a high-performance analog signal processing section. Further, a digital signal processing section comprising the normal complementary MOS transistor can be formed on the same substrate. It is therefore possible to realize a low-cost, one-chip semiconductor integrated circuit incorporating both a high-performance analog circuit and a digital circuit. Use of the aforementioned fabrication method can inhibit strain of the heterojunction structure of each epitaxially grown portion to relax, thereby allowing the characteristics of the heterojunction structure to be exhibited advantageously.

At least part of the normal complementary MOS transistors may have a gate insulator which is substantially thicker than a gate insulator of each of the heterojunction complementary MOS transistors. This feature makes it possible to form a normal complementary MOS transistor adapted to high Vdd and a heterojunction complementary MOS transistor on the same substrate while inhibiting deterioration in the characteristics of the heterojunction structures of the heterojunction complementary MOS transistor.

It is possible that the single semiconductor material of each of the ordinary MOS transistors is Si, while the different semiconductor materials of each of the heterojunction MOS transistors are Si and SiGe.

At least part of the heterojunction complementary MOS transistors may be heterojunction dynamic threshold complementary MOS transistors. This feature allows, for example, an n-channel heterojunction MOS transistor of the analog signal processing section to operate at a lower voltage.

It is possible that: the semiconductor integrated circuit has one or more low-source-voltage complementary MOS transistors which each operate at a source voltage lower than a predetermined voltage, and one or more high-source-voltage complementary MOS transistors which each operate at a source voltage higher than the predetermined voltage, wherein the heterojunction dynamic threshold complementary MOS transistors constitute at least part of the low-source-voltage complementary MOS transistors, while the normal complementary MOS transistors constitute at least part of the high-source-voltage complementary MOS transistors. With this arrangement, since the heterojunction dynamic threshold complementary MOS transistors which are each capable of operating at a higher speed with a low voltage is used as the low-source-voltage complementary MOS transistors, internal circuits except an interface with the outside require lower power consumption and operate at a higher speed.

It is possible that the semiconductor integrated circuit has an analog signal processing section, wherein the heterojunction complementary MOS transistors constitute at least part of complementary MOS transistors included in the analog signal processing section, while the normal complementary MOS transistors constitute complementary MOS transistors included in the rest of the semiconductor integrated circuit.

It is possible that the semiconductor integrated circuit has only a digital signal processing section as a signal processing section, wherein the heterojunction complementary MOS transistors constitute at least part of complementary MOS transistors included in the digital signal processing section, while the normal complementary MOS transistors constitute complementary MOS transistors included in the rest of the semiconductor integrated circuit.

The semiconductor integrated circuit may be provided with a communication function.

The foregoing and other objects, features and advantages of the present invention will become apparent from the following detailed description of the preferred embodiments to be read with reference to the accompanying drawings.

BRIEF DESCRIPTION OF THE DRAWINGS

FIG. 1A is a view illustrating a semiconductor integrated circuit incorporating both a digital signal processing section and an analog signal processing section in which CMOS which calls for high performance in the analog signal processing section comprises an HCMOS; FIG. 1B is a view illustrating a semiconductor integrated circuit incorporating both a digital signal processing section and an analog signal processing section in which CMOSs which call for high performance in respective of the analog signal processing section 3 and the digital signal processing section 2 comprise an HCMOS each; FIG. 1C is a view illustrating a semiconductor integrated circuit 1 incorporating only a digital signal processing section in which CMOS which calls for high performance in the digital signal processing section comprises an HCMOS; and FIG. 1D is a view illustrating a semiconductor integrated circuit incorporating only an analog signal processing section in which CMOS which calls for high performance in the analog signal processing section comprises an HCMOS.

FIG. 10 is a table comparing embodiment 2 of the mode for carrying out the present invention to prior-art technologies as to cost, analog performance and digital performance.

FIG. 11A is a view illustrating the concept of SiGe BiCMOS technology, while FIG. 11B is a view illustrating the concept of RF CMOS technology.

FIGS. 12A to 12F are sectional views illustrating step by step a second method of fabricating the semiconductor integrated circuit shown in FIG. 6 as a variation.

FIGS. 13A to 13F are sectional views illustrating step by step a second method of fabricating the semiconductor integrated circuit shown in FIG. 8 as a variation.

DETAILED DESCRIPTION OF THE PREFERRED EMBODIMENTS

Hereinafter, the mode for carrying out the present invention will be described with reference to the drawings.

Mode for Carrying out the Present Invention

Figure 1A:
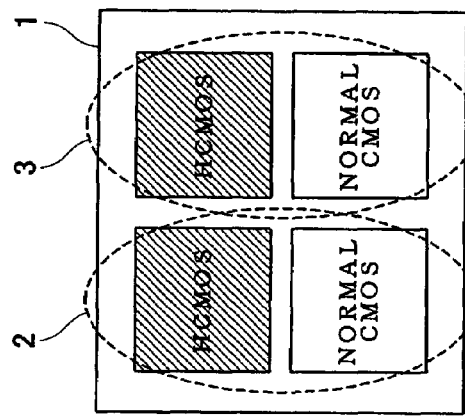
FIGS. 1A to 1D are each a schematic view illustrating a concept of a semiconductor integrated circuit according to a mode for carrying out the present invention; specifically.
Figure 1B:
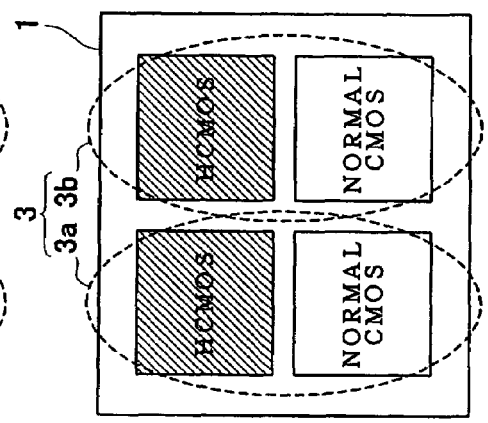
Figure 1C:
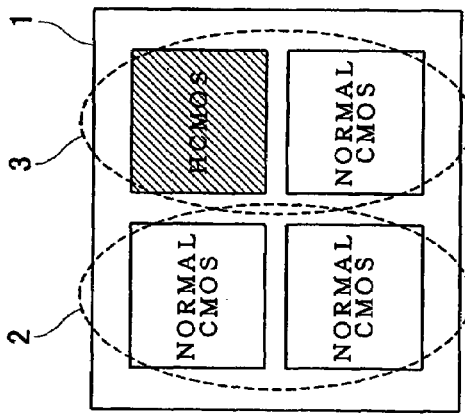
Figure 1D:
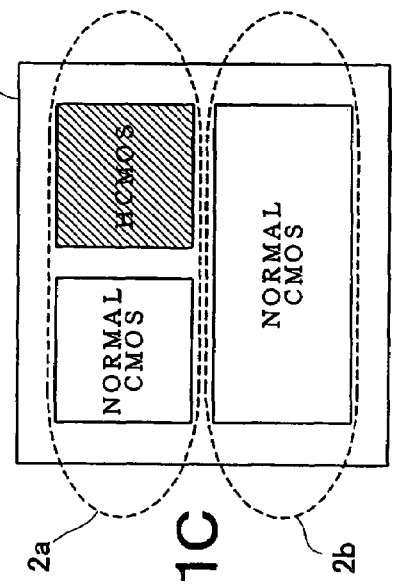
Figure 2:
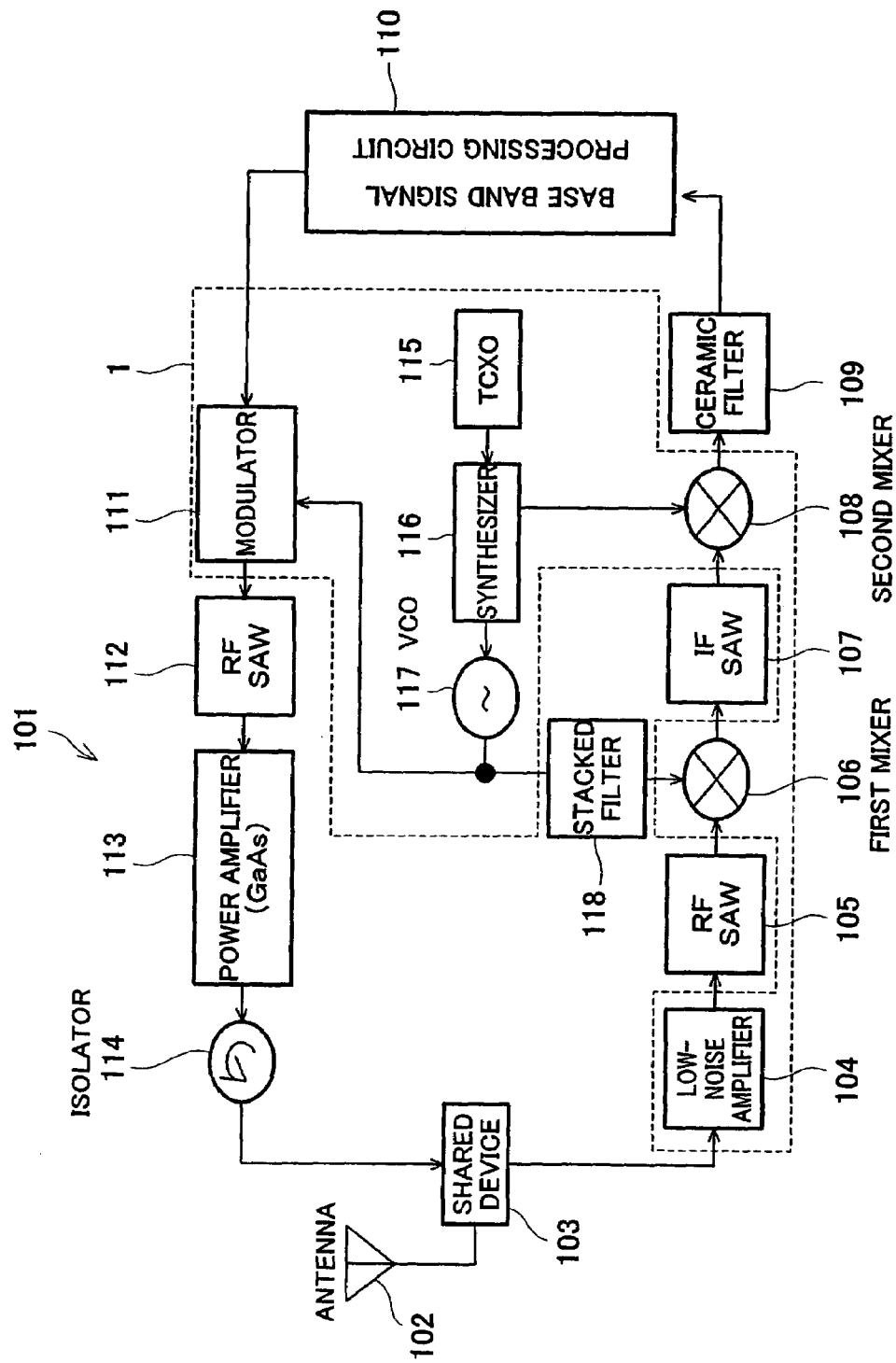
FIG. 2 is a circuit diagram of an example of a communication circuit of a mobile phone to which semiconductor integrated circuit 1 shown in FIG. 1 is applied.

FIGS. 1A to 1D are each a schematic view illustrating a concept of a semiconductor integrated circuit according to the mode for carrying out the present invention; specifically, FIG. 1A is a view illustrating semiconductor integrated circuit 1 incorporating both a digital signal processing section 2 and an analog signal processing section 3 in which CMOS which calls for high performance in the analog signal processing section 3 comprises an HCMOS; FIG. 1B is a view illustrating semiconductor integrated circuit 1 incorporating both the digital signal processing section 2 and the analog signal processing section 3 in which CMOSs which call for high performance in respective of the analog signal processing section 3 and the digital signal processing section 2 comprise an HCMOS each; FIG. 1C is a view illustrating semiconductor integrated circuit 1 incorporating only the digital signal processing section 2 in which that CMOS which calls for high performance in the digital signal processing section 2 comprises an HCMOS; and FIG. 1D is a view illustrating semiconductor integrated circuit 1 incorporating only the analog signal processing section 2 in which that CMOS which calls for high performance in the analog signal processing section 2 comprises an HCMOS. FIG. 2 is a circuit diagram of an example of a communication circuit of a mobile phone to which semiconductor integrated circuit 1 shown in FIG. 1 is applied.

FIG. 1 illustrates the concept of semiconductor integrated circuit 1 according to the mode for carrying out the present invention. "Normal CMOS" and "HCMOS" each represent the type of one or more CMOSs used in the digital signal processing section 2 or the analog signal processing section 3. Accordingly, embodiments of semiconductor integrated circuit 1 according to the mode for carrying out the present invention include: a case where semiconductor integrated circuit 1 incorporates both the digital signal processing section 2 and the analog signal processing section 3 on one chip; a case where semiconductor integrated circuit 1 incorporates only the digital signal processing section 2 on one chip; and a case where semiconductor integrated circuit 1 incorporates only the analog signal processing section 3 on one chip.

The first configuration shown in FIG. 1A incorporates both the digital signal processing section 2 and the analog signal processing section 3 on one chip. In this configuration, a CMOS which calls for high performance in the analog signal processing section 3 comprises an HCMOS, while the other CMOS in the analog signal processing section 3 and the CMOSs in the digital signal processing section 2 comprise a normal CMOS each.

The second configuration shown in FIG. 1B incorporates both the digital signal processing section 2 and the analog signal processing section 3 on one chip. In this configuration, CMOSs which call for high performance in respective of the analog signal processing section 3 and the digital signal processing section 2 comprise an HCMOS each, while the other CMOSs in respective of the analog signal processing section 3 and the digital signal processing section 2 comprise a normal CMOS each.

The third configuration shown in FIG. 1C incorporates only the digital signal processing section 2 on one chip. In this configuration, a CMOS which calls for high performance in the digital signal processing section 2 comprise an HCMOS, while other CMOSs comprise a normal CMOS each. In a specific example of this configuration, a chip includes an internal circuit 2a and an interface (I/O (input/output)) 2b with the outside. In this example, CMOS of the CMOSs in the internal circuit 2a which operates at a low source voltage comprises an HCMOS, while the other CMOS in the internal circuit 2a and the CMOS of the interface 2b comprise a normal CMOS each.

The fourth configuration shown in FIG. 1D is semiconductor integrated circuit 1 incorporating only analog signal processing sections 3a and 3b on one chip. CMOSs which call for high performance in the analog signal processing sections 3a and 3b comprise an HCMOS each, while other CMOSs comprise a normal CMOS each. Though the chip shown in FIG. 1D has the two analog signal processing sections 3a and 3b, the number of such analog signal processing sections may be more than two.

Description will be made of an exemplary application of semiconductor integrated circuit 1 to an actual circuit.

Here, a communication circuit 101 of a mobile phone as shown in FIG. 2 is illustrated. Since the specific functions of this communication circuit 101 have no relation to the essence of the present invention, description thereof will be omitted. The communication circuit 101 has antenna 102, shared device 103, low-noise amplifier 104, RF SAW (surface acoustic wave) 105, first mixer 106, IF SAW 107, second mixer 108, ceramic filter 109, base band signal processing circuit 110, modulator 111, RF SAW 112, power amplifier 113, isolator 114, TCXO (temperature-compensated crystal oscillator) 115, synthesizer 116, VCO 117, and stacked filter 118.

Among them, low-noise amplifier 104, first mixer 106, second mixer 108, modulator 111, TCXO 115, synthesizer 116 and VCO 117 are formed as incorporated in semiconductor integrated circuit 1 as a one-chip radio IC. The low-noise amplifier 104, first mixer 106, second mixer 108, modulator 111, TCXO 115, synthesizer 116 and VCO 117, as a whole, include the analog signal processing section 3 and the digital signal processing section 2, though any one of them allows high-frequency signals to pass therethrough. Of the CMOSs used in the analog signal processing section 3 and the digital signal processing section 2, a CMOS which calls for high performance in at least the analog signal processing section 3 comprises an HCMOS while the other CMOSs comprise a normal CMOS each, as shown in FIG. 1A or 1B. The term "high frequency", as used in the present specification, means a frequency of 800 MHz or higher.

In the configuration shown in FIG. 1A, a p-channel HMOS (hereinafter will be referred to as "pHMOS"), which enables the carrier mobility to be enhanced by virtue of heterojunction, can realize a low-voltage operation and reduced low-frequency noise thereby forming high-performance analog signal processing circuit 3. Further, the digital signal processing section 2 comprising existing normal CMOSs can be formed on the same substrate and, hence, a low-cost, low-risk and high-performance integrated circuit incorporating both an analog circuit and a digital circuit can be constructed. With such a configuration as shown in FIG. 1B, in the necessary portion of the digital signal processing section 2, the pHMOS, which enables the carrier mobility to be enhanced by virtue of heterojunction, can realize a low-voltage operation thereby forming high-performance digital signal processing circuit 2.

Description will be made of embodiments of the semiconductor integrated circuit shown in FIG. 1.

Embodiment 1

Embodiment 1 of the mode for carrying out the present invention shows an example in which an HCMOS is formed on the same substrate together with normal CMOSs.

Figure 3:
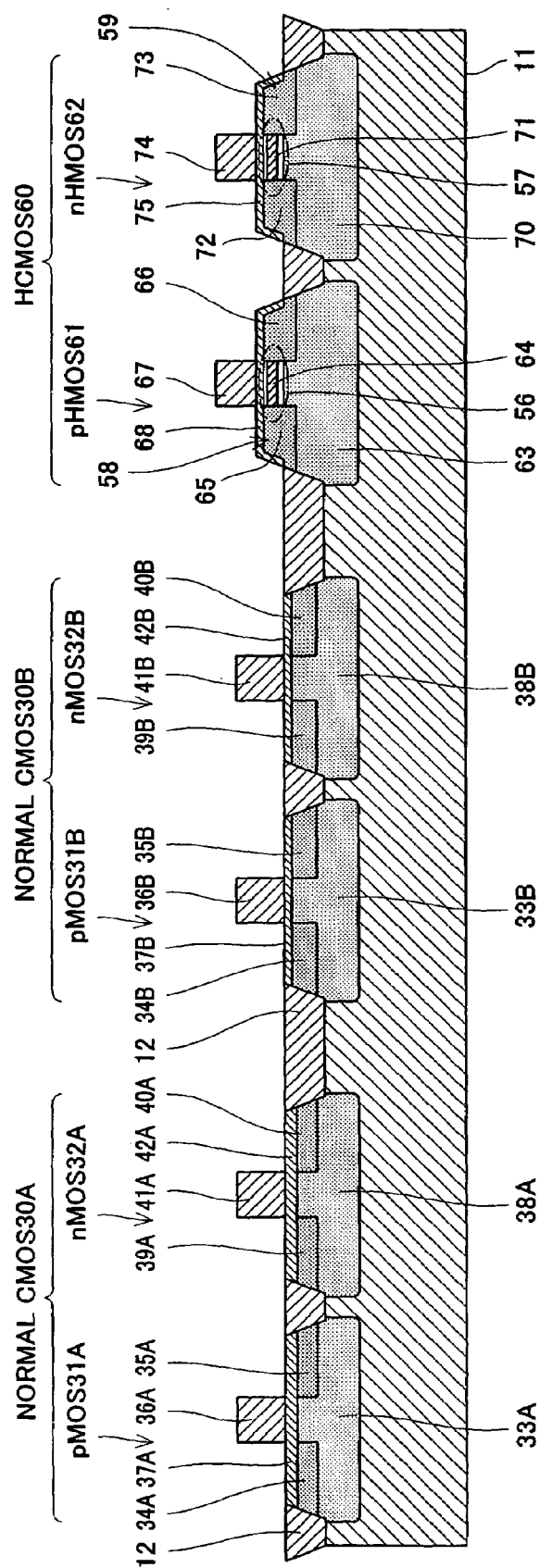
FIG. 3 is a sectional view showing the configuration of a semiconductor integrated circuit according to embodiment 1 of the mode for carrying out the present invention.

FIG. 3 is a sectional view showing the configuration of a semiconductor integrated circuit according to this embodiment. As shown in FIG. 3, this embodiment has normal CMOSs including a normal CMOS 30A adapted to a source voltage of 3.3V (hereinafter will be referred to as "high-Vdd normal CMOS") for controlling the I/O system and a normal CMOS 30B adapted to a source voltage lower than the former (hereinafter referred to as "low-Vdd normal CMOS"). The semiconductor integrated circuit according to this embodiment has a p-type bulk Si substrate (hereinafter will be referred to as "substrate") 11. The normal CMOSs 30A and 30B and an HCMOS 60 are formed as arranged adjacent to each other on this substrate 11.

The normal CMOS 30A comprises a pMOS 31A and an n-channel MOS (hereinafter will be referred to as "nMOS") 32A, which are juxtaposed to each other. The normal CMOS 30B comprises a pMOS 31B and an nMOS 32B, which are juxtaposed to each other. The HCMOS 60 comprises a pHMOS 61 and an nHMOS 62, which are juxtaposed to each other. The MOSs 31A, 32A, 31B, 32B, 61 and 62 are device-isolated from each other by STI (shallow trench isolation) 12 formed on the surface of the substrate 11. In the pMOSs 31A and 31B, gate insulators 37A and 37B each comprising $SiO_2$ are formed in respective MOS forming regions each surrounded by STI 12 at the surface of the substrate 11 and gate electrodes 36A and 36B each comprising polysilicon are formed on the gate insulators 37A and 37B, respectively. Below the surface of the substrate 11, p-type source regions 34A and 34B and drain regions 35A and 35B are formed on opposite sides of the respective gate electrodes 36A and 36B. Further, n-type wells (hereinafter will be referred to as "n-well(s)") 33A and 33B are formed in regions of the substrate 11 situated below the gate electrodes 36A and 36B, source regions 34A and 34b and drain regions 35A and 35B. In the nMOSs 32A and 32B, gate insulators 42A and 42B each comprising $SiO_2$ are formed in respective MOS forming regions each surrounded by STI 12 at the surface of the substrate 11 and gate electrodes 41A and 41B each comprising polysilicon are formed on the gate insulators 42A and 42B, respectively. N-type source regions 39A and 39B and drain regions 40A and 40B are formed below the surface of the substrate 11 on opposite sides of the respective gate electrodes 39A and 39B. Further, p-type wells (hereinafter will be referred to as "p-well(s)") 38A and 38B are formed in regions of the substrate 11 situated below the gate electrodes 41A and 41B, source regions 39A and 39b and drain regions 40A and 40B.

In the pHMOS 61, an epitaxially grown portion 58 is formed on an HMOS forming region (selective epitaxial growth region) surrounded by STI 12 at the surface of the substrate 11 and a gate insulator 68 comprising $SiO_2$ is formed over the surface of the epitaxially grown portion 58. A gate electrode 67 comprising polysilicon is formed on the gate insulator 68. In regions extending from the epitaxially grown portion 58 to an upper portion of the substrate 11 on opposite sides of the gate electrode 67, p-type source region 65 and drain region 66 are formed. Further, an undoped heterojunction structure 56 is formed in a region of the epitaxially grown portion 58 situated below the gate electrode 67.

The heterojunction structure 56 comprises a Si buffer layer, a SiGe layer 64 and a Si cap layer, which are stacked sequentially on the substrate 11. The thickness of the Si buffer layer is preferably not more than 10 nm, more preferably not more than 5 nm. In this embodiment, the thickness of the Si buffer layer is 10 nm. The thickness of the SiGe layer 64 is preferably not more than 20 nm, more preferably not more than 15 nm. In this embodiment, the thickness of the SiGe layer is about 10 nm. The thickness of the Si cap layer is preferably not more than 10 nm. In this embodiment, the thickness of the Si cap layer is about 5 nm. The Ge concentration of the SiGe layer 64 is preferably not less than 10% and not more than 60%, more preferably not less than 20% and not more than 40%. In this embodiment, the Ge concentration of the SiGe layer 64 is about 30%. An n-well 63 is formed in a region of the substrate 11 extending under the heterojunction structure 56, source region 65 and drain region 66.

In the nHMOS 62, on the other hand, an epitaxially grown portion 59 is formed on an HMOS forming region surrounded by STI 12 at the surface of the substrate 11 and a gate insulator 75 comprising $SiO_2$ is formed to cover the surface of the epitaxially grown portion 59. A gate electrode 74 comprising polysilicon is formed on the gate insulator 75. In regions extending from the epitaxially grown portion 59 to an upper portion of the substrate 11 on opposite sides of the gate electrode 74, n-type source region 72 and drain region 73 are formed. Further, an undoped heterojunction structure 57 is formed in a region of the epitaxially grown portion 59 situated below the gate electrode 74. The heterojunction structure 57 comprises a Si buffer layer, a SiGe layer 71 and a Si cap layer, which are stacked sequentially on the substrate 11. The thickness of the Si buffer layer is preferably not more than 10 nm, more preferably not more than 5 nm. In this embodiment, the thickness of the Si buffer layer is 10 nm. The thickness of the SiGe layer 71 is preferably not more than 20 nm, more preferably not more than 15 nm. In this embodiment, the thickness of the SiGe layer 71 is about 10 nm. The thickness of the Si cap layer is preferably not more than 10 nm. In this embodiment, the thickness of the Si cap layer is about 5 nm. The Ge concentration of the SiGe layer 71 is preferably not less than 10% and not more than 60%, more preferably not less than 20% and not more than 40%. In this embodiment, the Ge concentration of the SiGe layer 71 is about 30%. A p-well 70 is formed in a region of the substrate 11 extending under the heterojunction structure 57, source region 72 and drain region 73.

Each of the MOSs 31A, 32A, 31B, 32B, 61 and 62 is provided with sidewall, silicide, contact hole, wiring, and the like, which are not shown.

Next, description will be made of a fabrication method of the semiconductor integrated circuit thus constructed. FIGS. 4A to 4F are sectional views illustrating step by step a first method of fabricating the semiconductor integrated circuit shown in FIG. 3.

Initially, at the step illustrated in FIG. 4A, the surface of p-type bulk silicon substrate 11 having (100) face as a main face (hereinafter will be referred to as "substrate") is subjected to device isolation with STI 12. Subsequently, wells 33A, 33B, 38A, 38B, 63 and 70 having respective conductivity types suited to corresponding MOSs to be constructed are formed in respective MOS forming regions of the substrate 11 device-isolated from each other with STI 12 by ion implantation and activation annealing. Thereafter, a protective oxide film 201 is formed over the surface of the substrate 11 by deposition or thermal oxidation and then etched by patterning with resist 202 to expose a region 203 of the surface of the substrate 11 to be formed with pHMOS and nHMOS. The resist 202 is then removed by ashing or the like.

Subsequently, at the step illustrated in FIG. 4B, an undoped Si layer (which eventually becomes a Si buffer layer), a SiGe layer (which eventually becomes SiGe layers 64 and 71) and a Si layer are sequentially epitaxially grown on pHMOS- and nHMOS-forming regions (of the silicon surface) in the exposed region 203 of the surface of the substrate 11 selectively by the UHV-CVD process or the like. By so doing, projecting epitaxially grown portions 58 and 59 having the same structure are formed at a time. Here, the thickness of the lower Si layer is preferably not more than 10 nm, more preferably not more than 5 nm. In this case the thickness of the lower Si layer is 10 nm. The thickness of the SiGe layer is preferably not more than 20 nm, more preferably not more than 15 nm. In this case the thickness of the SiGe layer is 10 nm. The thickness of the upper Si layer is preferably not more than 30 nm, more preferably not more than 20 nm. In this case the thickness of the upper Si layer is about 15 nm.

Subsequently, at the step illustrated in FIG. 4C, the protective oxide film 201 is removed by wet etching with diluted hydrofluoric acid and the surface of the substrate 11 is cleaned.

In turn, at the step illustrated in FIG. 4D, a $SiO_2$ oxide film (not shown) is formed over the entire surface of the substrate 11 by oxidation. The thickness of this $SiO_2$ oxide film is preferably not less than 5 nm and not more than 12 nm. In this case the thickness of this $SiO_2$ oxide film is about 10 nm. Thereafter, a high-Vdd MOS forming region (including regions for both pMOS and nMOS) is covered with a resist pattern (not shown) and then portions of the $SiO_2$ oxide film covering the low-Vdd MOS forming region (including regions for both pMOS and nMOS) and the HMOS forming region (including regions for both pHMOS and nHMOS) are etched away, followed by removal of the aforementioned resist pattern. By so doing, gate insulators 37A and 42A each comprising the oxide film of about 10 nm thickness are formed on the high-Vdd MOS forming region.

Subsequently, at the step illustrated in FIG. 4E, the entire surface of the substrate 11 is oxinitrided to form an oxinitride film. The thickness of the oxinitride film is preferably not less than 1 nm and not more than 5 nm, more preferably not less than 1.5 nm and not more than 3 nm. In this case the thickness of the oxinitride film is about 2 nm.

At that time, the gate insulators 37A and 42A on the high-Vdd MOS forming region are nitrided, but are varied little in thickness. In this way gate insulators 37B, 42B, 68 and 75 each comprising the oxinitride film of about 2 nm thickness are formed on the low-Vdd MOS forming region and the HMOS forming region. Further, the thickness of the Si layer forming the uppermost layer of each of the epitaxially grown portions 58 and 59 becomes about 5 nm, which is a designed value in this embodiment.

Subsequently, at the step illustrated in FIG. 4F, a polysilicon film (not shown) is deposited over the entire surface of the substrate 11 by the LPCVD process or a like process and then ions of impurities meeting respective of the conductivity types of the channels of respective MOSs are implanted to the polysilicon film. Thereafter, gate electrodes are formed on the gate insulators of respective MOS forming regions by dry etching with a resist pattern. Thus, gate electrodes 36A, 36B and 67 each comprising p-type polysilicon are formed on the gate insulators 37A, 37B and 68, respectively, while gate electrodes 41A, 41B and 74 each comprising n-type polysilicon are formed on the gate insulators 38A, 38B and 75, respectively.

Subsequently, for all the MOS forming regions, formations of sidewall, extension pocket region, source/drain regions, silicide, contact hole, wiring and the like are each formed in the same process. In this way, the normal CMOS 30A comprising high-Vdd pMOS and NMOS, the normal CMOS 30b comprising low-Vdd pMOS and NMOS and the HCMOS 60 comprising pHMOS and nHMOS are completed on the same substrate 11.

This embodiment can integrate the conventional normal CMOSs and the high-performance HCMOS having heterojunction on the same substrate 11 with a reduced number of additional process steps (with two or three lithography steps), thereby making it possible to realize the high-performance integrated circuit with reduced cost.

Next, description will be made of a second method of fabricating the semiconductor integrated circuit according to this embodiment. The above-described first fabrication method needs heat treatment at least twice for forming gate insulators after selective epitaxial growth and might cause strain of the SiGe layer of each epitaxially grown portion to relax by such heat treatment. The second fabrication method overcomes these problems.

FIGS. 5A to 5F are sectional views illustrating step by step the second method of fabricating the semiconductor integrated circuit according to this embodiment.

Figure 4:
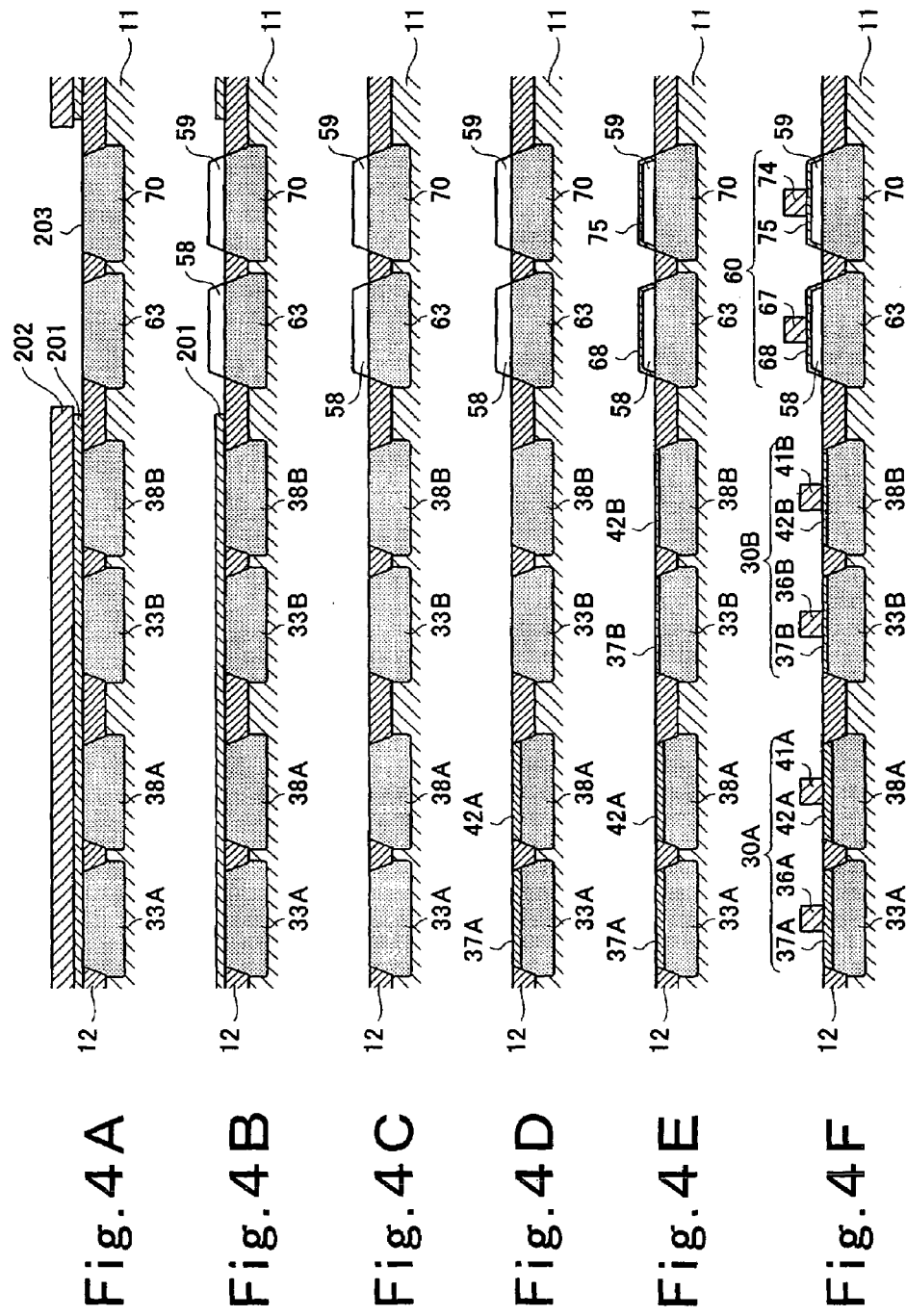
FIGS. 4A to 4F are sectional views illustrating step by step a first method of fabricating the semiconductor integrated circuit shown in FIG. 3.
Figure 5:
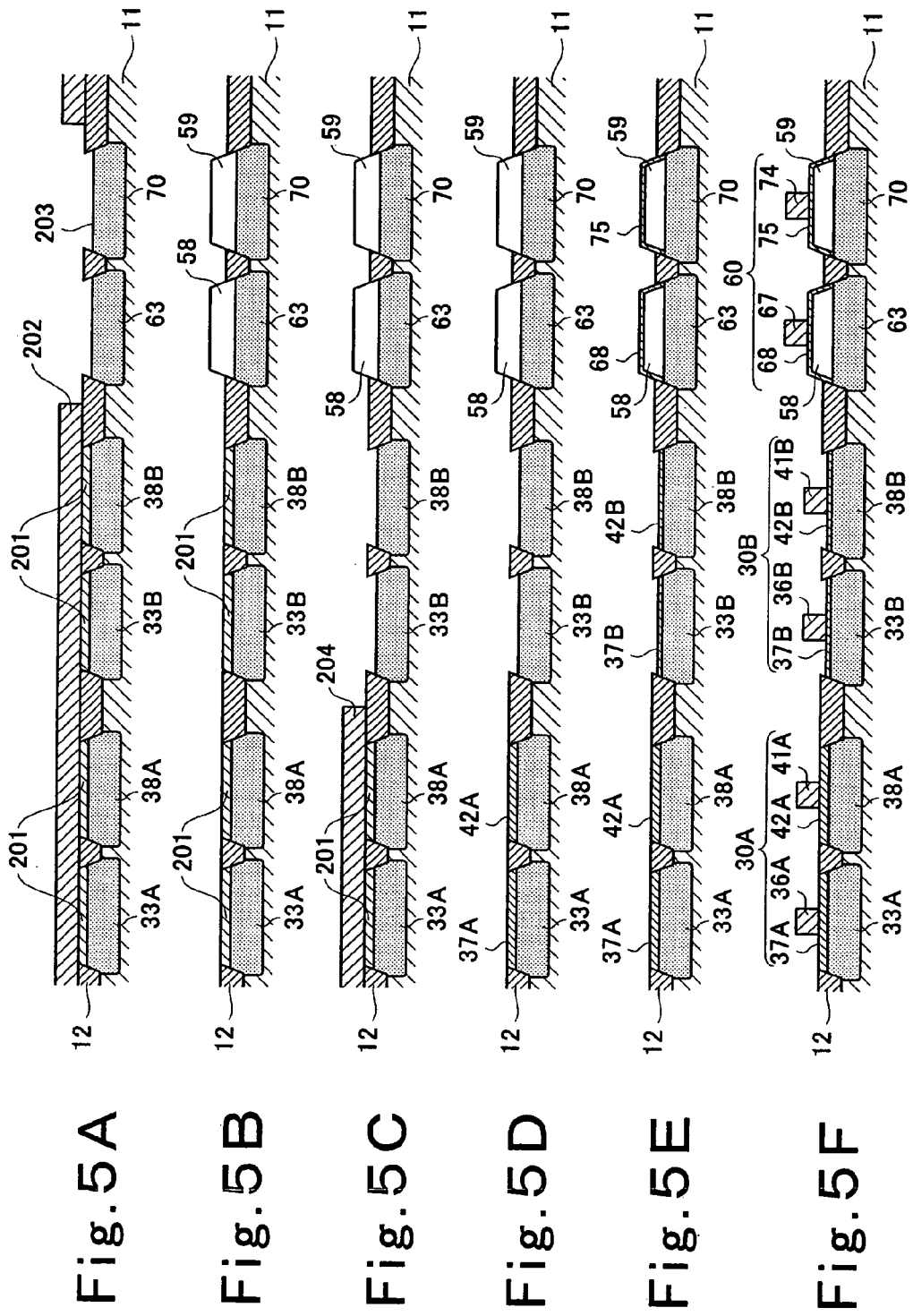
FIGS. 5A to 5F are sectional views illustrating step by step a second method of fabricating the semiconductor integrated circuit shown in FIG. 3 as a variation.

The second fabrication method is different from the first fabrication method illustrated in FIG. 4 in the following features, but is same as the first fabrication method in other features.

That is, at the initial step illustrated in FIG. 5A, wells 33A, 33B, 38A, 38B, 63 and 70 having respective conductivity types suited to corresponding MOSs to be constructed are formed in respective MOS forming regions of the substrate 11 device-isolated from each other with STI 12. Thereafter, the entire surface of the substrate 11 is subjected to thermal oxidation to form protective oxide film 201 over the entire surface of the substrate 11. STI 12 is also thermally oxidized at that time, but is varied little in thickness. For this reason, the thermal oxide film is not shown here. The thickness of the protective oxide film 201 in portions overlying the wells 33A, 33B, 38A, 38B, 63 and 70 is preferably not less than 5 nm and not more than 12 nm. In this case the thickness of the protective oxide film 201 is about 10 nm.

Subsequently, a portion of the protective oxide film 201 covering a predetermined region 203 of the surface of the substrate 11 is removed by wet etching with hydrofluoric acid through patterning using resist 202, whereby the surfaces of wells 63 and 70 (pHMOS forming region and nHMOS forming region) are exposed. A step 204 resulting from the removal of protective oxide film 210 between the original surface of the substrate 11 and the surfaces of the wells 63 and 70 (substantially equal to the step between the surface of STI 12 and the surfaces of the wells 63 and 70) is about 4 nm.

Subsequently, at the step illustrated in FIG. 5B, epitaxially grown portions 58 and 59 are formed on the surfaces of the wells 63 and 70 of the substrate 11 selectively.

In turn, at the step illustrated in FIG. 5C, a high-Vdd MOS forming region (including regions for both pMOS and nMOS above the wells 33A and 38A) is covered with a resist pattern 204 and then portions of the protective oxide film 201 covering a low-Vdd MOS forming region (including regions for both pMOS and nMOS above the wells 33B and 38B) are etched away with hydrofluoric acid. Thereafter, at the step shown in FIG. 5D, the resist pattern 204 is removed. By so doing, gate insulators 37A and 42A are formed on the high-Vdd MOS forming region.

Subsequently, at the step illustrated in FIG. 5E, the entire surface of the substrate 11 is oxinitrided to form an oxinitride film. The thickness of the oxinitride film is preferably not less than 1 nm and not more than 5 nm, more preferably not less than 1.5 nm and not more than 3 nm. In this case the thickness of the oxinitride film is about 2 nm. In this way gate insulators 37B, 42B, 68 and 75 each comprising the oxinitride film of about 2 nm thickness are formed on the low-Vdd MOS forming region and the HMOS forming region.

The remainder of the process is the same as in the first fabrication method. As apparent from comparison with the first fabrication method illustrated in FIG. 4, the semiconductor integrated circuit obtained by the second fabrication method is structurally characterized in that the under surface of each of the epitaxially grown portions 58 and 59 of the HCMOS 60 (specifically, the under surface of each undoped Si buffer layer) and the under surface of each of the gate insulators 37A, 42A, 37B and 42B of the normal CMOSs 30A and 30B are located at substantially equal depth in a direction along the thickness of the substrate 11 as a trace of this fabrication method.

According to the second fabrication method, the epitaxial growth region is defined using the thermal oxide film 201 formed on the surface of the substrate 11 and the portion of the thermal oxide film covering the high-Vdd CMOS 30A forming region is not removed but utilized as the gate insulators 37A and 42A. According to the first fabrication method, in contrast, heat treatment needs to be performed at least twice for the formation of gate insulators after the selective epitaxial growth and besides the heat treatment might relax strain of the SiGe layer of each epitaxially grown portion. Since the second fabrication method forms the gate insulators 37A and 42A of the high-Vdd CMOS 30A prior to the selective epitaxial growth, the number of times of heat treatment required after the selective epitaxial growth is reduced by one, which results in the process simplified by this reduction. Further, since the number of times of heat treatment required after the selective epitaxial growth is reduced, strain of the SiGe layer of each epitaxially grown portion is inhibited to relax, thus allowing the SiGe layer to exhibit its characteristics advantageously.

Embodiment 2

Embodiment 2 of the mode for carrying out the present invention shows an example in which a heterojunction dynamic threshold CMOS as an HCMOS is formed on the same substrate together with normal CMOSs.

Figure 6:
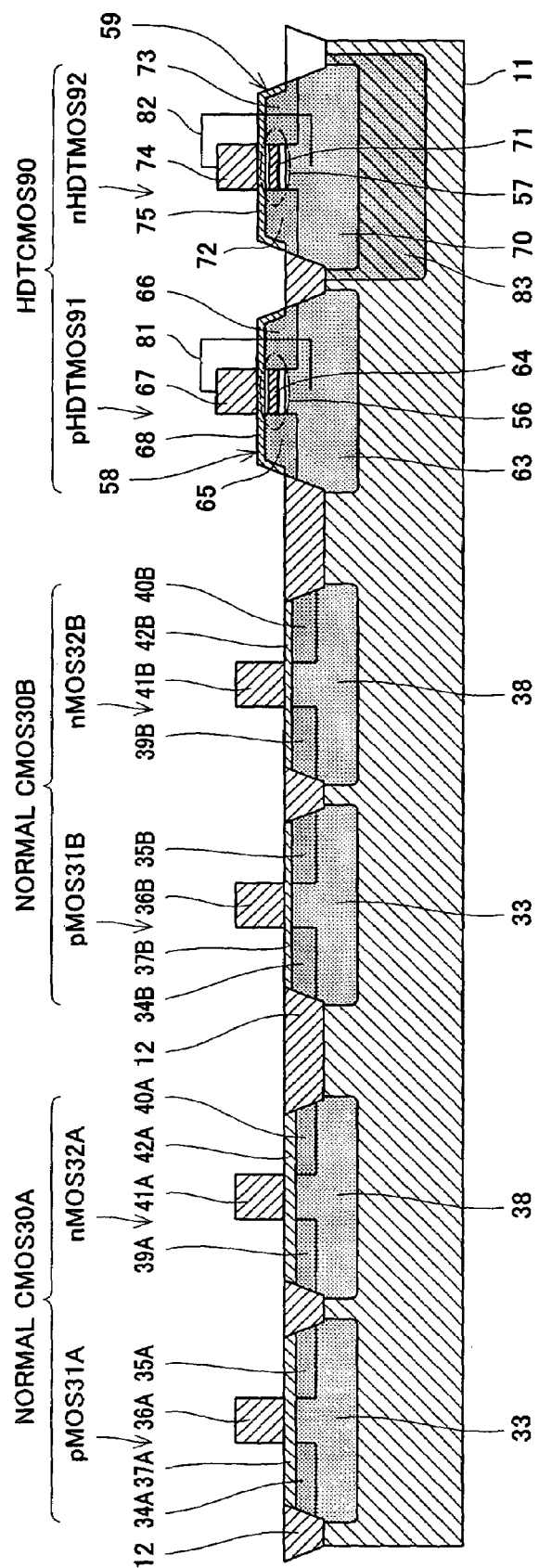
FIG. 6 is a sectional view showing the configuration of a semiconductor integrated circuit according to embodiment 2 of the mode for carrying out the present invention.
Figure 7:
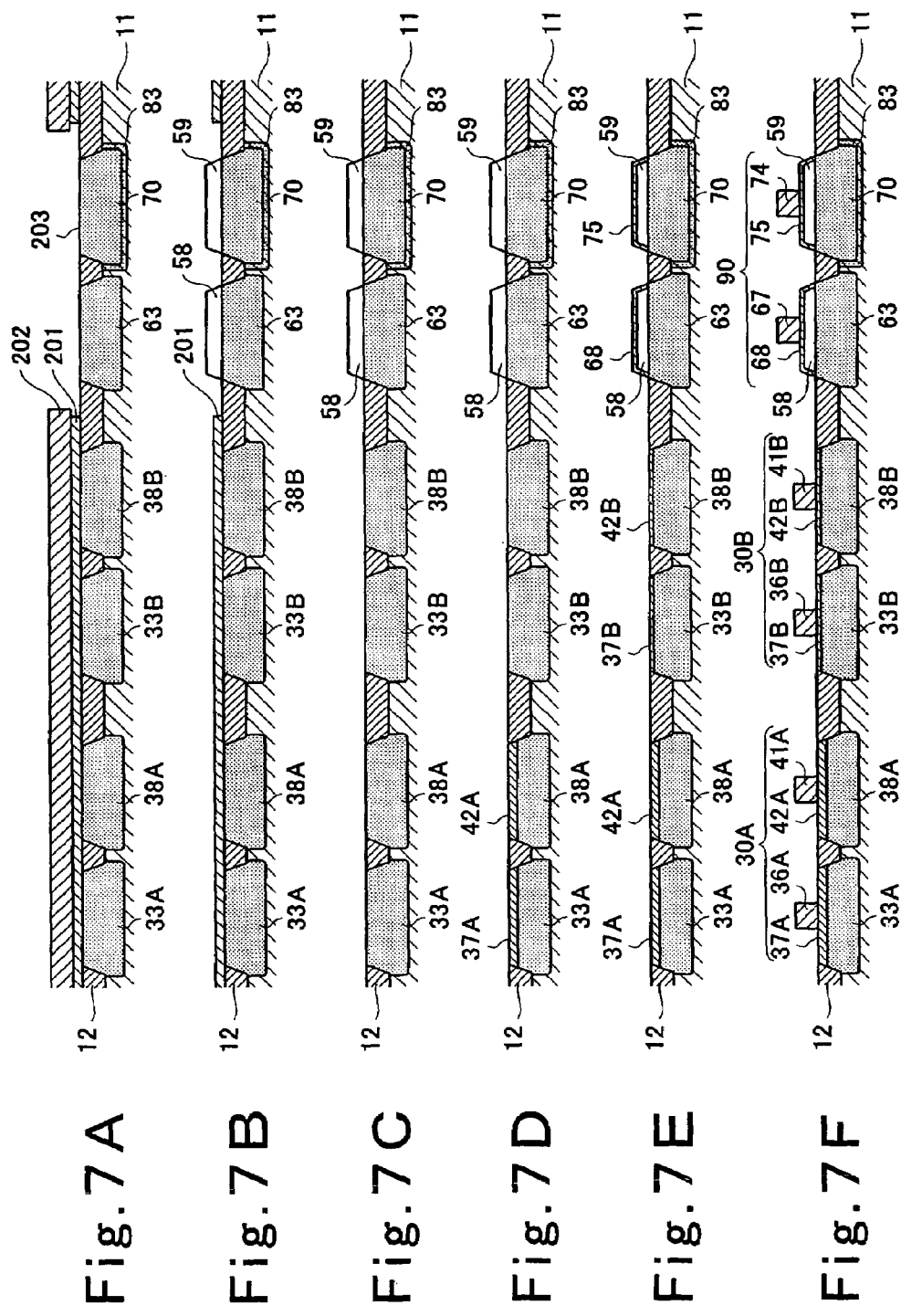
FIGS. 7A to 7F are sectional views illustrating step by step a first method of fabricating the semiconductor integrated circuit shown in FIG. 6.

FIG. 6 is a sectional view showing the configuration of a semiconductor integrated circuit according to this embodiment; FIGS. 7A to 7B are sectional views illustrating step by step a first method of fabricating the semiconductor integrated circuit shown in FIG. 6; and FIGS. 12A to 12B are sectional views illustrating step by step a second method of fabricating the semiconductor integrated circuit shown in FIG. 6

In this embodiment an HDTCMOS 90 is formed instead of the HCMOS 60 of embodiment 1. This embodiment is same as embodiment 1 in other features.

Specifically, the HDTCMOS 90 comprises a pHDTMOS 91 and an nHDTMOS 92 as shown in FIG. 6. The pHDTMOS 91 is a MOS additionally comprising a contact 81 interconnecting the n-well (body) 63 and the gate electrode 67 in the pHMOS 61 shown in FIG. 3. The nHDTMOS 91 is a MOS additionally comprising a contact 82 interconnecting the p-well (body) 70 and the gate electrode 74 and an n-type triple well 83 surrounding the p-well 70 in the nHMOS 61 shown in FIG. 3.

The first method of fabricating the semiconductor circuit thus configured includes the step shown in FIG. 7A at which the n-type triple well 83 is formed to surround the p-well 70 in an nHDTMOS forming region of the substrate 11, and the step shown in 7F at which the contact (not shown) interconnecting the n-well 63 and the gate electrode 67 and the contact (not shown) interconnecting the p-well 70 and the gate electrode 74 are formed. This fabrication method is same as the first method of fabricating the semiconductor integrated circuit of embodiment 1 (FIG. 4) in other features. The second method of fabricating the semiconductor circuit configured as above includes the step shown in FIG. 12A at which the n-type triple well 83 is formed to surround the p-well 70 in the nHDTMOS forming region of the substrate 11, and the step shown in FIG. 12F at which the contact (not shown) interconnecting the n-well 63 and gate electrode the 67 and the contact (not shown) interconnecting the p-well 70 and the gate electrode 74 are formed. This fabrication method is same as the second method of fabricating the semiconductor integrated circuit of embodiment 1 (FIG. 5) in other features.

The semiconductor integrated circuit according to this embodiment is capable of controlling the well potential because the n-type triple well is formed in the nHDTMOS 92. The impurity concentration of this triple well 83 is preferably set to a value not less than $1 \times 10^{16}/cm^3$ and not more than $1 \times 10^{18}/cm^3$, more preferably not less than $5 \times 10^{16}/cm^3$ and not more than $5 \times 10^{17}/cm^3$. In this case the impurity concentration of the triple well 83 is set to $1 \times 10^{17}/cm^3$ so that the potential of the p-well 70 situated inside can be controlled. Further, the threshold voltages of respective of the pHDTMOS 91 and the nHDTMOS 92 can be adjusted by adjusting the impurity concentrations of their respective wells. Specifically, the impurity concentration of the p-well 70 of the nHDTMOS 92 is preferably set to a value not less than $5 \times 10^{16}/cm^3$ and not more than $1 \times 10^{19}/cm^3$, more preferably not less than $1 \times 10^{17}/cm^3$ and not more than $5 \times 10^{18}/cm^3$. The threshold voltage of the nHDTMOS 92 is preferably set to a value not less than 0.1V and not more than 0.4V. In this case the impurity concentration of the p-well 70 is set to $2 \times 10^{17}/cm^3$ whereby the threshold voltage is set to about 0.3V. In the case of the pHDTMOS 91, on the other hand, the threshold voltage thereof can be lowered by virtue of the band offset effect of the SiGe layer 64 and, hence, the impurity concentration of the n-well 63 can be set relatively high and is preferably set to a value not less than $1 \times 10^{17}/cm^3$ and not more than $2 \times 10^{19}/cm^3$. The threshold voltage of the pHDTMOS 91 is preferably set to a value not less than 0.1V and not more than 0.4V. In this case the impurity concentration is set to $2 \times 10^{18}/cm^3$ whereby the threshold voltage is set to about 0.25V. In this embodiment thus configured, the pHDTMOS 91, which is capable of enhancing the carrier mobility by the heterojunction, realizes a low-voltage operation and reduced low-frequency noise and the nHDTMOS 92 realizes a low-voltage operation. Thus, this embodiment is capable of forming a high-performance analog processing section. What is more, the digital signal processing section comprising normal CMOSs can be formed on the same substrate and, hence, it is possible to construct a low-cost, low-risk and high-performance integrated circuit incorporating both the analog signal processing section and the digital signal processing section.

Embodiment 3

Embodiment 3 of the mode for carrying out the present invention shows an example in which a HCMOS and an HDTCMOS are formed on the same substrate together with normal CMOSs.

Figure 8:
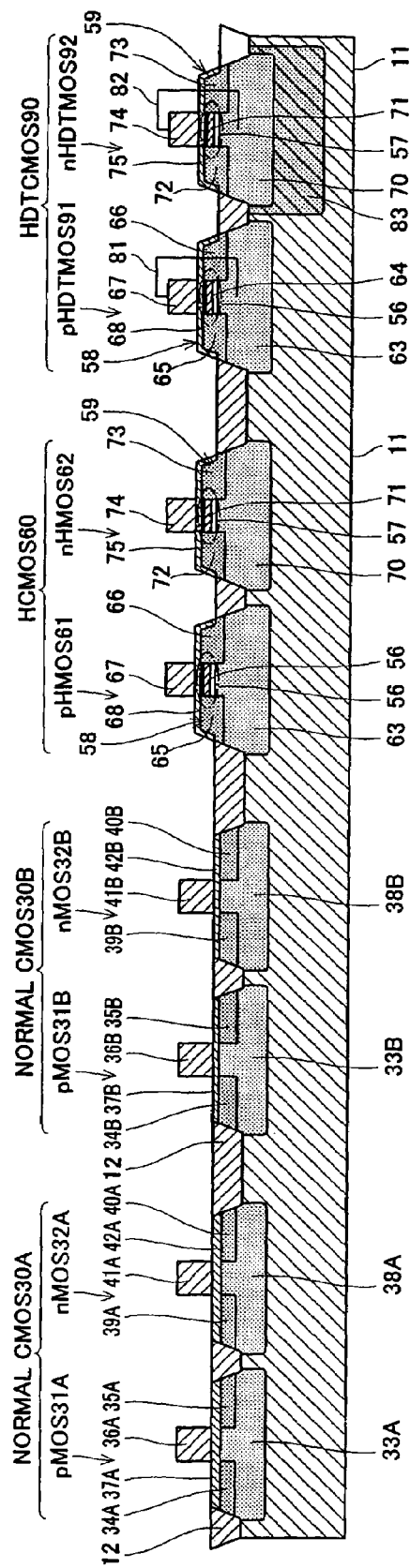
FIG. 8 is a sectional view showing the configuration of a semiconductor integrated circuit according to embodiment 3 of the mode for carrying out the present invention.
Figure 9:
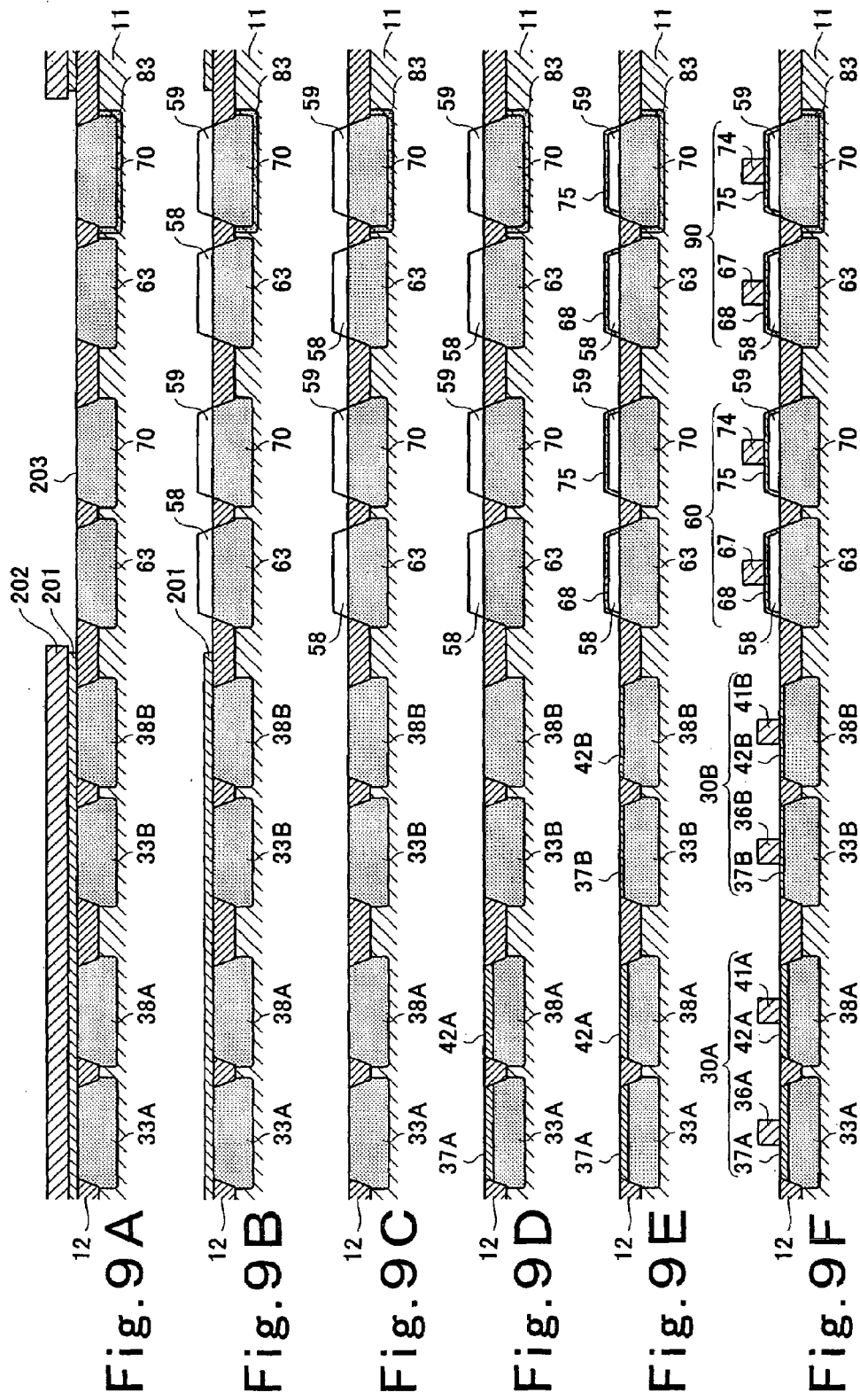
FIGS. 9A to 9F are sectional views illustrating step by step a first method of fabricating the semiconductor integrated circuit shown in FIG. 8.
Figure 11B:
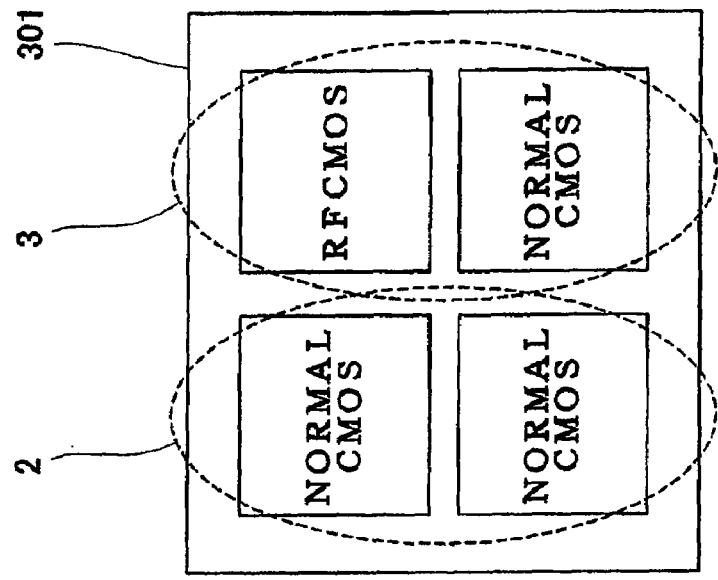
FIGS. 11A and 11B are each a schematic view illustrating a prior-art semiconductor integrated circuit; specifically.
Figure 11A:
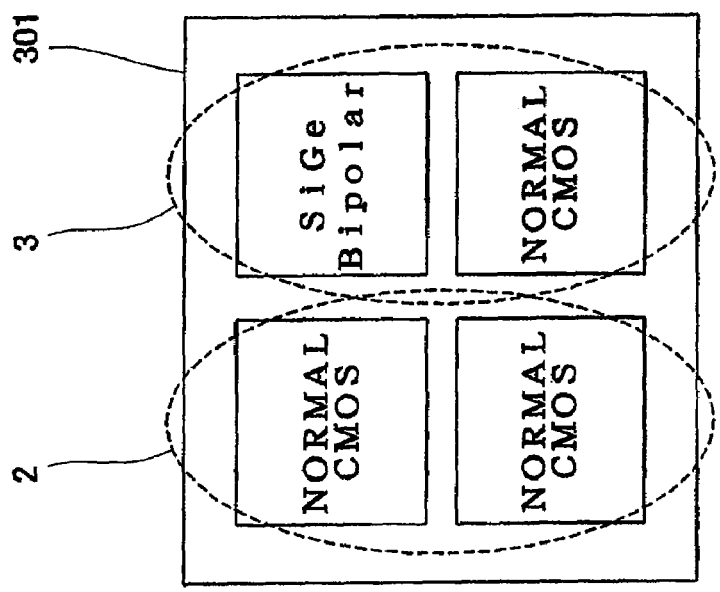

FIG. 8 is a sectional view showing the configuration of a semiconductor integrated circuit according to this embodiment; FIGS. 9A to 9B are sectional views illustrating step by step a first method of fabricating the semiconductor integrated circuit shown in FIG. 8; and FIGS. 13A to 13B are sectional views illustrating step by step a second method of fabricating the semiconductor integrated circuit shown in FIG. 8.

As shown in FIG. 8, this embodiment further includes an HDTMOS on the substrate 11 in the semiconductor integrated circuit of embodiment 1. This embodiment is same as embodiment 1 in other features.

In the semiconductor integrated circuit of this embodiment, the HCMOS 60 is used in an analog RF circuit of high breakdown voltage and low noise. For example, the HCMOS 60 is used in a transmitting/receiving device such as a power amplifier or a low-noise amplifier. The HCMOS 90 is used in a low-voltage, low-noise analog RF processing circuit or a low-voltage digital logic circuit, while the normal CMOSs used in other digital or analog circuit.

As shown in FIGS. 9A to 9F and 13A to 13F, the semiconductor integrated circuit of this embodiment can be fabricated by forming the HDTCMOS 90 on the substrate 11 at the same time with the formation of other CMOSs in each of the first and second methods of fabricating the semiconductor integrated circuit of embodiment 1 (illustrated in FIGS. 4A to 4F and FIGS. 5A to 5F, respectively).

Embodiment 4

Figure 14:
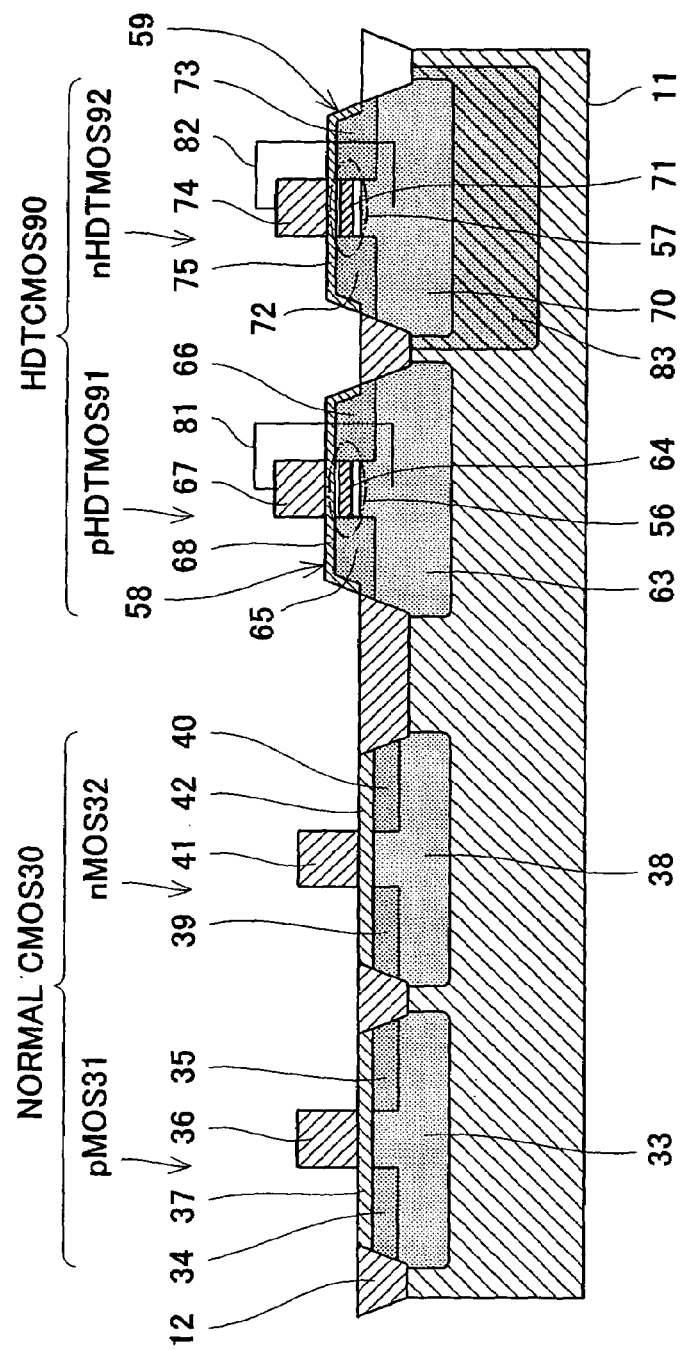
FIG. 14 is a sectional view showing the configuration of a semiconductor integrated circuit according to embodiment 4 of the mode for carrying out the present invention.

FIG. 14 is a sectional view showing the configuration of a semiconductor integrated circuit according to embodiment 4. As shown in FIG. 14, the semiconductor integrated circuit of this embodiment comprises only a digital circuit and has a normal CMOS 30 and an HDTCMOS 90 formed on the substrate 11. The normal CMOS 30 has the same structure as the normal CMOS 30A of embodiment 2 and is used as a high-Vdd CMOS, while the HDTCMOS 90 used as a low-Vdd CMOS. Methods of fabricating the semiconductor integrated circuit of this embodiment are the same as the fabrication methods of embodiment 2 (illustrated in FIGS. 7A to 7F and FIGS. 12A to 12F).

FIG. 10 is a table comparing this embodiment to prior-art technologies as to cost, analog performance and digital performance.

In FIG. 10, the "HDTCMOS" represents this embodiment (the present invention) while the "BiCMOS" and the "RFCMOS" represent the SiGe BiCMOS technology and the RF CMOS technology, respectively, which have been described in Description of the Related Art.

As apparent from FIG. 10, this embodiment is substantially equal to or slightly higher than the RFCMOS but is lower than the BiCMOS in terms of cost. This embodiment is lower than the BiCMOS but is higher than the RFCMOS in terms of analog performance. In terms of digital performance, this embodiment is higher than either of the BiCMOS and the RFCMOS particularly at low voltage. Accordingly, as compared to the RFCMOS which is lower than the BiCMOS in terms of cost but is inferior to the BiCMOS in terms of analog performance, this embodiment is substantially equal to or slightly higher than the RFCMOS in terms of cost but is higher than the RFCMOS in terms of both analog performance and digital performance. Thus, this embodiment can be said to be capable of realizing a one-chip semiconductor integrated circuit which is low in cost and high in both analog performance and digital performance.

While the foregoing description has been directed to the case where the semiconductor integrated circuit according to the present invention is applied to the communication circuit of a mobile phone, it is needless to say that the present invention is applicable to other circuit incorporating both an analog circuit and a digital circuit.

In each of embodiments 1 to 3, one of the normal CMOS 30A and the normal CMOS 30B may be omitted. Even in this case, the semiconductor integrated circuit can be fabricated by a fabrication method similar to any one of the fabrication methods of embodiments 1 to 3.

It will be apparent from the foregoing description that many improvements and other embodiments of the present invention may occur to those skilled in the art. Therefore, the foregoing description should be construed as an illustration only and is provided for the purpose of teaching the best mode for carrying out the present invention to those skilled in the art. The details of the structure and/or the function of the present invention can be modified substantially without departing from the spirit of the present invention.

What is claimed is:

1. A semiconductor integrated circuit comprising:
   a single substrate;
   a normal complementary MOS transistor comprising ordinary MOS transistors each having a basic structure including a metal, an oxide and a semiconductor, the semiconductor consisting of a single semiconductor; and
   a heterojunction complementary MOS transistor comprising heterojunction MOS transistors each having said basic structure, the semiconductor of said basic structure consisting of different semiconductors forming a heterojunction, wherein:
   one or more such normal complementary MOS transistors and one or more such heterojunction complementary MOS transistors are formed on the single substrate;
   a portion of each of the heterojunction MOS transistors including the heterojunction is epitaxially grown on the substrate;
   a under surface of the epitaxially grown portion of each of the heterojunction MOS transistors and a under surface of a gate insulator of each of the ordinary MOS transistors are located at substantially equal depth in a direction along the thickness of the substrate,
   the epitaxially grown portion of each of the heterojunction MOS transistors includes a buffer layer, a heterojunction layer and a cap layer, which are sequentially epitaxially grown on the substrate in a thickness direction thereof and made of the semiconductor; and
   a under surface of the buffer layer and the under surface of the gate insulator of each of the ordinary MOS transistors are located at substantially equal depth in the direction along the thickness of the substrate.

2. The semiconductor integrated circuit according to claim 1, wherein at least part of the normal complementary MOS transistors have a gate insulator which is substantially thicker than a gate insulator of each of the heterojunction complementary MOS transistors.

3. The semiconductor integrated circuit according to claim 1, wherein the single semiconductor of each of the ordinary MOS transistors is Si, while the different semiconductors of each of the heterojunction MOS transistors are Si and SiGe.

4. The semiconductor integrated circuit according to claim 1, wherein at least part of the heterojunction complementary MOS transistors are heterojunction dynamic threshold complementary MOS transistors.

5. The semiconductor integrated circuit according to claim 4, which has one or more low-source-voltage complementary MOS transistors which each operates at a source voltage lower than a predetermined voltage, and one or more high-source-voltage complementary MOS transistors which each operates at a source voltage higher than the predetermined voltage, wherein the heterojunction dynamic threshold complementary MOS transistors constitute at least part of the low-source-voltage complementary MOS transistors, while the normal complementary MOS transistors constitute the high-source-voltage complementary MOS transistors.

6. The semiconductor integrated circuit according to claim 1, which has an analog signal processing section, wherein the heterojunction complementary MOS transistors constitute at least part of complementary MOS transistors included in the analog signal processing section, while the normal complementary MOS transistors constitute complementary MOS transistors included in the rest of the semiconductor integrated circuit.

7. The semiconductor integrated circuit according to claim 1, which has only a digital signal processing section as a signal processing section, wherein the heterojunction complementary MOS transistors constitute at least part of complementary MOS transistors included in the digital signal processing section, while the normal complementary MOS transistors constitute complementary MOS transistors included in the rest of the semiconductor integrated circuit.

8. The semiconductor integrated circuit according to claim 1, which is provided with a communication function.

* * * * *